(12) United States Patent
Kuznetsov et al.

(10) Patent No.: US 10,769,320 B2
(45) Date of Patent: Sep. 8, 2020

(54) INTEGRATED USE OF MODEL-BASED METROLOGY AND A PROCESS MODEL

(71) Applicant: KLA-Tencor Corporation, Milpitas, CA (US)

(72) Inventors: Alexander Kuznetsov, Mountain View, CA (US); Andrei V. Shchegrov, Campbell, CA (US); Stilian Ivanov Pandev, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 830 days.

(21) Appl. No.: 14/107,850

(22) Filed: Dec. 16, 2013

(65) Prior Publication Data

US 2014/0172394 A1    Jun. 19, 2014

Related U.S. Application Data

(60) Provisional application No. 61/738,760, filed on Dec. 18, 2012.

(51) Int. Cl.
| | |
|---|---|
| *G06F 30/20* | (2020.01) |
| *G03F 7/20* | (2006.01) |
| *G06F 30/398* | (2020.01) |

(52) U.S. Cl.
CPC .......... *G06F 30/20* (2020.01); *G03F 7/70625* (2013.01); *G03F 7/70641* (2013.01); *G06F 30/398* (2020.01)

(58) Field of Classification Search
CPC ............ G03F 7/70625; G03F 7/70633; G03F 7/70641; G03F 7/7065; G03F 7/50;
(Continued)

(56) References Cited

U.S. PATENT DOCUMENTS

| | | |
|---|---|---|
| 6,673,638 B1 | 1/2004 | Bendik et al. |
| 7,009,704 B1 | 3/2006 | Nikoonahad et al. |

(Continued)

FOREIGN PATENT DOCUMENTS

| | | |
|---|---|---|
| CN | 101727517 A | 6/2010 |
| KR | 10-2011-0124638 | 12/2011 |

(Continued)

OTHER PUBLICATIONS

International Search Report and Written Opinion dated Apr. 15, 2014, for PCT Application No. PCT/US2013/075861 filed on Dec. 17, 2013, by KLA-Tencor Corporation, 14 pages.

(Continued)

*Primary Examiner* — Gregory J Toatley, Jr.
*Assistant Examiner* — Lynda Dinh
(74) *Attorney, Agent, or Firm* — Spano Law Group; Joseph S. Spano

(57) ABSTRACT

Methods and systems for performing measurements based on a measurement model integrating a metrology-based target model with a process-based target model. Systems employing integrated measurement models may be used to measure structural and material characteristics of one or more targets and may also be used to measure process parameter values. A process-based target model may be integrated with a metrology-based target model in a number of different ways. In some examples, constraints on ranges of values of metrology model parameters are determined based on the process-based target model. In some other examples, the integrated measurement model includes the metrology-based target model constrained by the process-based target model. In some other examples, one or more metrology model parameters are expressed in terms of other metrology model parameters based on the process model. In
(Continued)

some other examples, process parameters are substituted into the metrology model.

30 Claims, 14 Drawing Sheets

(58) Field of Classification Search
CPC ...... G03F 7/5009; G03F 7/5031; G06F 17/50; G06F 17/5009; G06F 17/5031; G06F 30/20; G06F 30/398
USPC ........................................................ 702/127
See application file for complete search history.

(56) References Cited

U.S. PATENT DOCUMENTS

| | | |
|---|---|---|
| 7,092,110 B2 | 8/2006 | Balasubramanian et al. |
| 7,312,881 B2 | 12/2007 | Shchegrov et al. |
| 7,334,202 B1 | 2/2008 | Singh et al. |
| 7,444,196 B2 | 10/2008 | Scheer et al. |
| 7,478,019 B2 | 1/2009 | Zangooie et al. |
| 7,567,353 B2 | 7/2009 | Bischoff et al. |
| 7,589,845 B1 | 9/2009 | Tian et al. |
| 7,642,100 B2 | 1/2010 | Yu et al. |
| 7,826,071 B2 | 11/2010 | Shchegrov et al. |
| 7,916,927 B2 | 3/2011 | Cramer et al. |
| 8,111,376 B2 | 2/2012 | Adel et al. |
| 8,245,160 B2 | 8/2012 | Ye et al. |
| 2004/0017575 A1 | 1/2004 | Balasubramanian et al. |
| 2008/0151269 A1 | 6/2008 | Vuong et al. |
| 2008/0241975 A1 | 10/2008 | Bischoff et al. |
| 2009/0076782 A1* | 3/2009 | Li ..................... G01N 21/4788 703/6 |
| 2009/0248339 A1 | 10/2009 | Xinkang et al. |
| 2010/0000292 A1* | 1/2010 | Karabacak ........... G01N 29/022 73/24.01 |
| 2010/0095264 A1 | 4/2010 | Huang et al. |
| 2010/0175033 A1* | 7/2010 | Adel ....................... G03F 7/705 716/52 |
| 2011/0246141 A1 | 10/2011 | Li |
| 2011/0246400 A1* | 10/2011 | Li .......................... G01B 11/24 706/12 |
| 2012/0226644 A1* | 9/2012 | Jin ....................... G06N 3/0454 706/19 |
| 2013/0110477 A1 | 5/2013 | Pandev |
| 2013/0262044 A1 | 10/2013 | Pandev et al. |
| 2013/0305206 A1 | 11/2013 | Pandev |

FOREIGN PATENT DOCUMENTS

| | | |
|---|---|---|
| TW | 200814216 A | 3/2008 |
| TW | 200818365 A | 4/2008 |
| TW | 200903686 A | 1/2009 |
| WO | 2008121955 A2 | 10/2008 |

OTHER PUBLICATIONS

Inventor(s): D.L. Kendell Title: A New Theory for the Anisotropic Etching of Silicon and Some Underdeveloped Chemical Micromachining Concepts Journal of Vacuum Science and Technology A, vol. 8, No. 4, pp. 3598-3605 (1990).

* cited by examiner

| PROCESS CORRELATIONS | | | |
|---|---|---|---|
| | H | SWA | CD |
| H | | -0.97 | 0.94 |
| SWA | | | -1.00 |
| CD | | | |

| PROCESS CORRELATIONS | | |
|---|---|---|
| | FOCUS | EXPOSURE |
| FOCUS | | -0.82 |
| EXPOSURE | | |

PRINCIPAL COMPONENTS

| Number | Eigenvalue | Percent | 20 40 60 80 | Cum Percent |
|---|---|---|---|---|
| 1 | 10.6397 | 88.664 | | 88.664 |
| 2 | 0.9504 | 7.920 | | 96.585 |
| 3 | 0.2808 | 2.340 | | 98.925 |
| 4 | 0.0756 | 0.630 | | 99.555 |
| 5 | 0.0125 | 0.104 | | 99.659 |
| 6 | 0.0116 | 0.097 | | 99.756 |
| 7 | 0.0071 | 0.059 | | 99.815 |
| 8 | 0.0067 | 0.056 | | 99.871 |
| 9 | 0.0050 | 0.041 | | 99.912 |
| 10 | 0.0042 | 0.035 | | 99.947 |
| 11 | 0.0034 | 0.028 | | 99.976 |
| 12 | 0.0029 | 0.024 | | 100.000 |

PRINCIPAL COMPONENTS

| Number | Eigenvalue | Percent | 20 40 60 80 | Cum Percent |
|---|---|---|---|---|
| 1 | 150.6931 | 75.347 | | 75.347 |
| 2 | 44.8300 | 22.415 | | 97.762 |
| 3 | 2.7828 | 1.391 | | 99.153 |
| 4 | 1.1746 | 0.587 | | 99.740 |
| 5 | 0.3254 | 0.163 | | 99.903 |
| 6 | 0.0877 | 0.044 | | 99.947 |
| 7 | 0.0290 | 0.015 | | 99.961 |
| 8 | 0.0267 | 0.013 | | 99.975 |
| 9 | 0.0179 | 0.009 | | 99.984 |
| 10 | 0.0123 | 0.006 | | 99.990 |
| 11 | 0.0086 | 0.004 | | 99.994 |
| 12 | 0.0044 | 0.002 | | 99.996 |
| 13 | 0.0028 | 0.001 | | 99.998 |
| 14 | 0.0019 | 0.001 | | 99.999 |
| 15 | 0.0012 | 0.001 | | 99.999 |
| 16 | 0.0005 | 0.000 | | 100.000 |
| 17 | 0.0004 | 0.000 | | 100.000 |
| 18 | 0.0002 | 0.000 | | 100.000 |
| 19 | 0.0002 | 0.000 | | 100.000 |
| 20 | 0.0001 | 0.000 | | 100.000 |
| 21 | 0.0001 | 0.000 | | 100.000 |
| 22 | 0.0000 | 0.000 | | 100.000 |
| 23 | 0.0000 | 0.000 | | 100.000 |
| 24 | 0.0000 | 0.000 | | 100.000 |
| 25 | 0.0000 | 0.000 | | 100.000 |
| 26 | 0.0000 | 0.000 | | 100.000 |
| 27 | 0.0000 | 0.000 | | 100.000 |
| 28 | 0.0000 | 0.000 | | 100.000 |
| 29 | 0.0000 | 0.000 | | 100.000 |
| 30 | 0.0000 | 0.000 | | 100.000 |

FIG. 17B

INTEGRATED USE OF MODEL-BASED METROLOGY AND A PROCESS MODEL

CROSS REFERENCE TO RELATED APPLICATION

The present application for patent claims priority under 35 U.S.C. § 119 from U.S. provisional patent application Ser. No. 61/738,760, entitled "Method for Integrated Use of Model-based Metrology and a Process Model," filed Dec. 18, 2012, the subject matter of which is incorporated herein by reference in its entirety.

TECHNICAL FIELD

The described embodiments relate to metrology systems and methods, and more particularly to methods and systems for improved parameter measurement.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

Traditionally, optical metrology is performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the measurement model parameters characterizing the target often cannot be reliably decoupled.

In response to these challenges, more complex optical tools have been developed. Measurements are performed over a large ranges of several machine parameters (e.g., wavelength, azimuth and angle of incidence, etc.), and often simultaneously. As a result, the measurement time, computation time, and the overall time to generate reliable results, including measurement recipes, increases significantly. In addition, the spreading of light intensity over large wavelength ranges decreases illumination intensity at any particular wavelength and increases signal uncertainty of measurements performed at that wavelength.

Future metrology applications present challenges for metrology due to increasingly small resolution requirements, multi-parameter correlation, increasingly complex geometric structures, and increasing use of opaque materials. Thus, methods and systems for improved measurements are desired.

SUMMARY

Methods and systems for optimizing measurement models based on integrating a process-based target model with a metrology-based target model are presented. By integrating a metrology based target model with process based target model, the predictive results of one or both of the metrology model and the process model are improved.

In one aspect, systems employing integrated measurement models are used to measure structural and material characteristics (e.g., material composition, dimensional characteristics of structures and films, etc.) of one or more targets. In another aspect, measurement systems employing integrated measurement models are used to directly measure process parameter values.

A process-based target model can be integrated with a metrology-based target model to generate an integrated measurement model in a number of different ways.

In some examples, constraints on ranges of values of metrology model parameters are determined based on the process-based target model. More specifically, the constraints are determined based on ranges of achievable values of process-model parameters.

In some other examples, the integrated measurement model includes the metrology-based target model constrained by the process-based target model. This reduces the size of the solution space associated with the integrated measurement model. In this manner, the process-based set of constraints on metrology-based target model parameters is defined by the process-based target model and applied to the metrology-based target model.

In some other examples, one or more metrology model parameters are expressed in terms of other metrology model parameters based on the process model. This reduces the total number of floating parameters of the integrated measurement model and reduces parameter correlation. This also increases the efficiency and robustness of the fitting engine (e.g., the regression engine) due to a smaller search space limited to target variations allowed by the manufacturing process.

In some other examples, process parameters are substituted into the metrology model. These process parameters are then resolved as part of the analysis of measurement data using the integrated measurement model. In this manner, the parameterization of the integrated measurement model includes process-based variables and the process parameter values are determined directly from the measurement signals.

In some examples, an integrated measurement model is used to measure process parameter values sequentially. The integrated measurement model includes a metrology-based target model used as part of a measurement analysis to determine geometric parameter values from measurement data. The integrated measurement model also includes a process-based model to determine process parameter values from the geometric parameter values.

In another aspect, the process model can be improved based on the metrology model. In some examples, the calibration of a process model is improved using information obtained from the metrology model. In one example, pre-characterized relationships between geometrical profile and process variations can be used for process recipe generation. In addition, the process model can be calibrated in a way that optimizes the metrology model.

In yet another aspect, the integrated measurement model can be assembled entirely, or in part, from a process-based target model.

In yet another aspect, the disclosed methods and systems may be employed in the context of multi-target modeling. In some examples, the integrated measurement model allows for the combined analysis of multiple targets where some targets are resolved using metrology model parameters while other targets are resolved using process parameters. In addition, constraints derived from a process model can be used to link parameters of different targets.

In yet another aspect, a cross-wafer process variation model may be combined with process-based models of target structures.

In yet another aspect, the integrated measurement model can be used to provide active feedback to a process tool (e.g., lithography tool, etch tool, deposition tool, etc.). For example, values of the depth and focus parameters determined using an integrated measurement model can be communicated to the lithography tool to adjust the lithography system to achieve a desired output. In a similar way etch parameters (e.g., etch time, diffusivity, etc.) or deposition parameters (e.g., time, concentration, etc.) may be included in the integrated measurement model to provide active feedback to etch tools or deposition tools, respectively.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

BRIEF DESCRIPTION OF THE DRAWINGS

FIG. 17A is a chart 220 illustrative of the results of a principal component analysis used as an indication of the process information content present in the process variations (focus and exposure).

FIG. 17B is a chart 230 illustrative of the results of a principal component analysis used as an indication of the process information content present in the measurement signals (e.g., alpha, beta).

DETAILED DESCRIPTION

Figure 1:
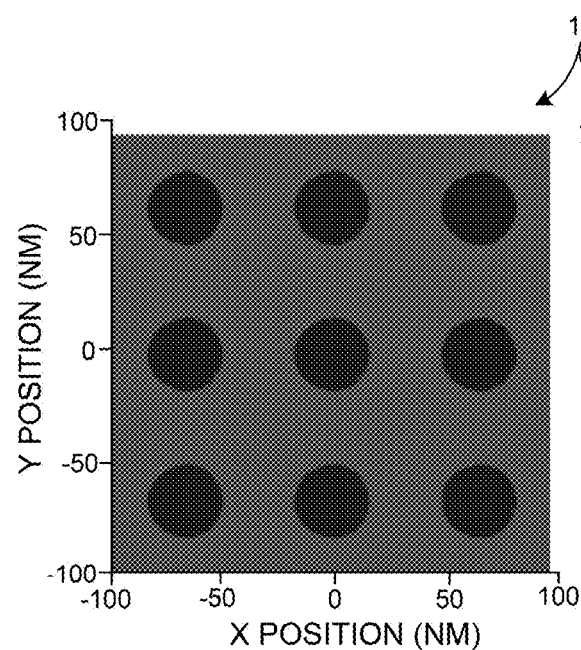
FIG. 1 is a plot illustrative of a top view 10 of a simulated 3×3 contact hole array modeled by lithography process simulation software.

Reference will now be made in detail to background examples and some embodiments of the invention, examples of which are illustrated in the accompanying drawings. Methods and systems for optimizing measurement models based on integrating a process-based target model with a metrology-based target model are presented. By integrating a metrology based target model with process based target model, the predictive results of one or both of the metrology model and the process model are improved.

In general, optical metrology techniques are indirect methods of measuring physical properties of a specimen under inspection. In most cases, the measured optical signals cannot be used to directly determine the physical properties of interest. Traditionally, the measurement process consists of formulating a metrology model that attempts to predict the measured optical signals based on a model of the interaction of the measurement target with the particular metrology system. The metrology-based target model includes a parameterization of the structure in terms of the physical properties of the measurement target of interest (e.g., film thicknesses, critical dimensions, refractive indices, grating pitch, etc.). In addition, the metrology-based target model includes a parameterization of the measurement tool itself (e.g., wavelengths, angles of incidence, polarization angles, etc.).

Machine parameters ($P_{machine}$) are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters ($P_{specimen}$) are parameters used to characterize the geometric and material properties of the specimen. For a thin film specimen, exemplary specimen parameters include refractive index, dielectric function tensor, nominal layer thickness of all layers, layer sequence, etc.

For measurement purposes, the machine parameters are treated as known, fixed parameters and the specimen parameters, or a subset of specimen parameters, are treated as unknown, floating parameters. The floating parameters are resolved by a fitting process (e.g., regression, library matching, etc.) that produces the best fit between theoretical predictions and measured data. The unknown specimen parameters, $P_{specimen}$, are varied and the model output values are calculated until a set of specimen parameter values are determined that results in a close match between the model output values and the measured values.

In many cases, the specimen parameters are highly correlated. This can lead to instability of the metrology-based target model. In some cases, this is resolved by fixing certain specimen parameters. However, this often results in significant errors in the estimation of the remaining parameters. For example, underlying layers (e.g., oxide base layers of a semiconductor material stack on a semiconductor wafer) are not uniformly thick over the surface of a wafer. However, to reduce parameter correlation, measurement models are constructed that treat these layers as having a fixed thickness over the surface of the wafer. Unfortunately, this may lead to significant errors in the estimation of other parameters.

In one aspect, systems employing integrated measurement models are used to measure structural and material characteristics (e.g., material composition, dimensional characteristics of structures and films, etc.) of one or more targets. The integrated measurement model is based on integrating a process-based target model with a metrology-based target model.

In another aspect, measurement systems employing integrated measurement models are used to directly measure process parameter values. The integrated measurement model is based on integrating a process-based target model with a metrology-based target model.

A process-based target model predicts structural properties (e.g., geometric properties, material properties, etc.) of the specimen in terms of process variables. A process-based target model suitable for integration with a metrology-based target model predicts structural and/or material properties to which the optical metrology tool is sensitive.

Figure 2:
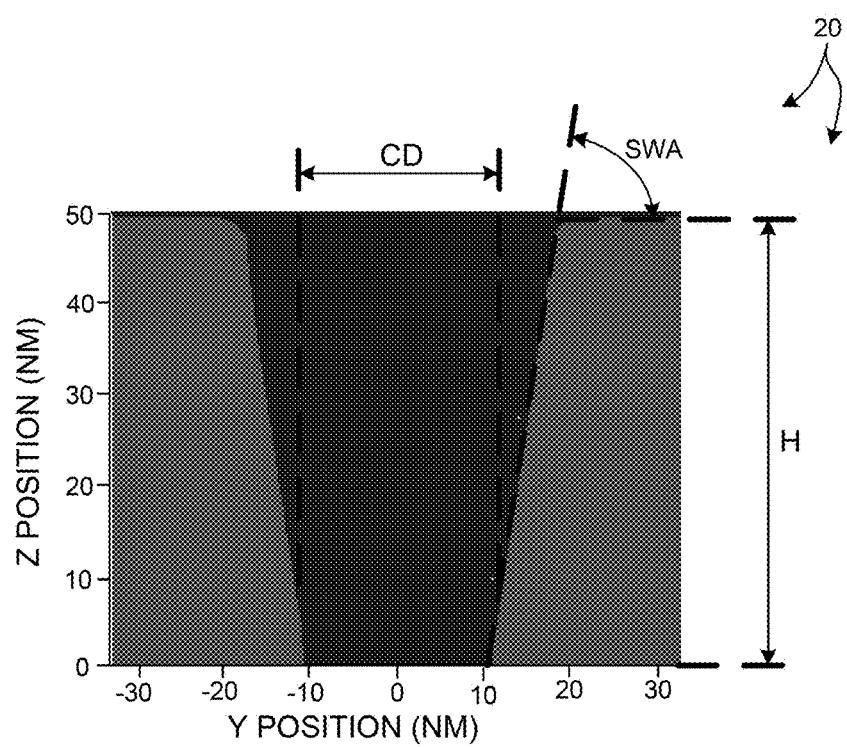
FIG. 2 is a plot illustrative of a side view 20 of a single hole of the contact hole array illustrated in FIG. 1.

FIGS. 1-2 illustrate simulation results from a process-based target model by way of non-limiting example. FIGS. 1-2 illustrate an Extreme Ultraviolet (EUV) lithography model of an array of contact holes generated using Positive Resist Optical Lithography (PROLITH) simulation software available from KLA-Tencor Corporation, Milpitas, Calif. (USA). Although this exemplary lithography process model is generated using PROLITH software, in general, any process modeling technique or tool may be contemplated within the scope of this patent document. FIG. 1 illustrates a top view 10 of a simulated 3×3 contact hole array modeled by PROLITH software. FIG. 2 illustrates a side view 20 of a single hole of the array. From the side view, several geometric parameters are illustrated. For example, the height (H), side wall angle (SWA), and critical dimension (CD) of the hole are illustrated. In the illustrated example, the critical dimension is a measure of the hole diameter five nanometers above the bottom of the hole.

Figure 3:
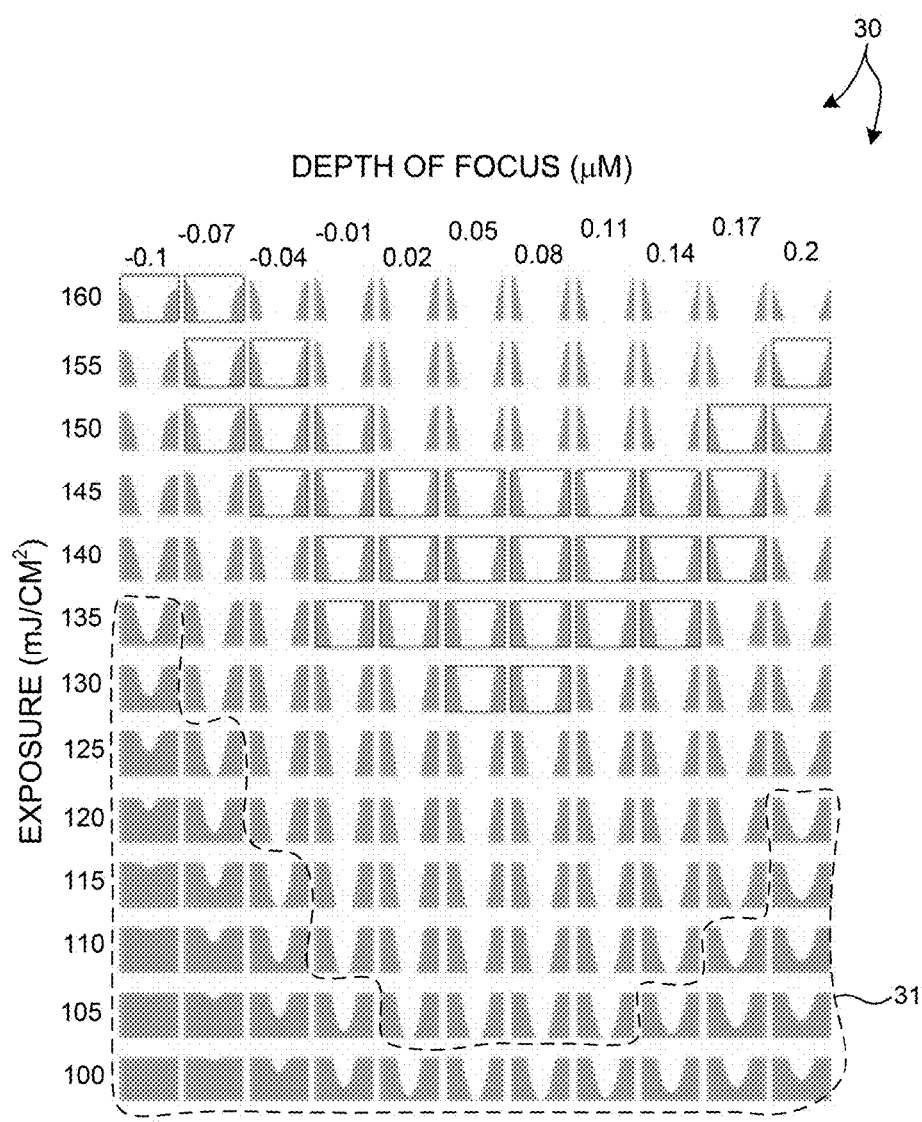
FIG. 3 is a plot illustrative of a side view 30 of an array of contact hole profiles each associated with a different combination of exposure and depth of focus parameter values.
Figure 4:
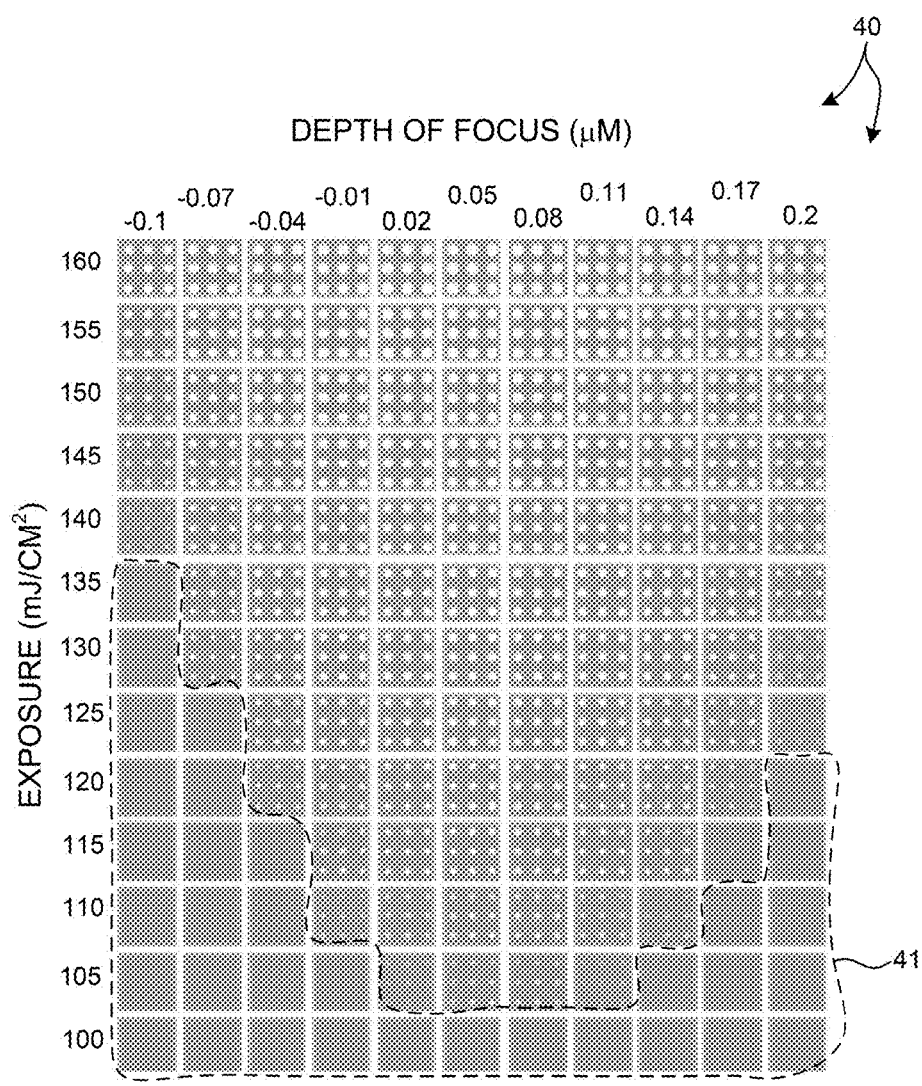
FIG. 4 is a plot illustrative of a top view 40 of the array of contact holes illustrated in FIG. 3.

A focus-exposure matrix (FEM) simulation experiment is run to generate a set of hole profiles analogous to the hole profile illustrated in FIG. 2. FIG. 3 illustrates a side view 30 of an array of contact hole profiles each associated with a different combination of exposure and depth of focus parameter values. The results illustrated in FIG. 3 were generated from a series of simulation experiments run by the PROLITH software. FIG. 4 illustrates a top view 40 of the same array of contact holes illustrated in FIG. 3. In this manner, geometric properties of the specimen (i.e., CD, H, SWA) are expressed in terms of process variables (i.e., focus and exposure) by the process-based target model.

Figure 5:
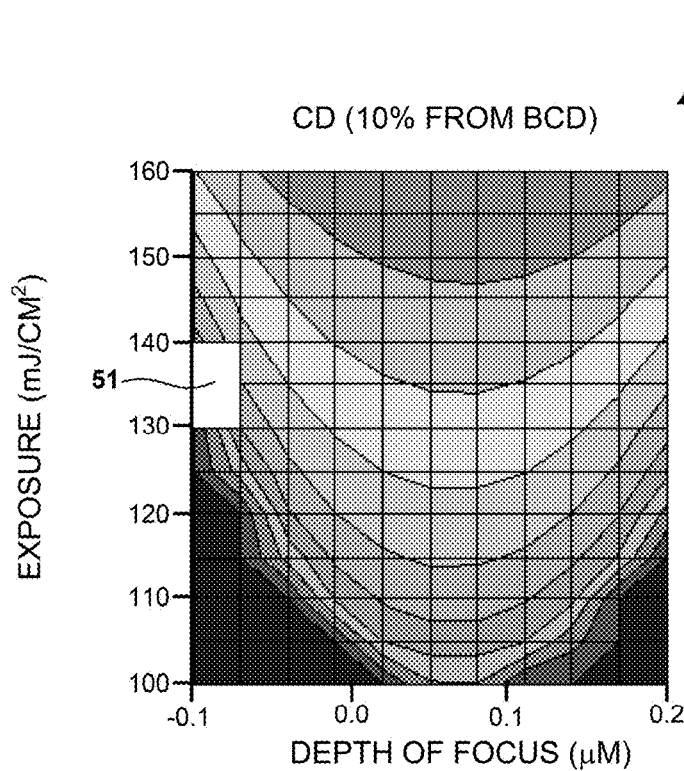
FIG. 5 is a contour plot 50 illustrative of critical dimension values associated with each of the focus exposure matrix results illustrated in FIGS. 3-4.
Figure 6:
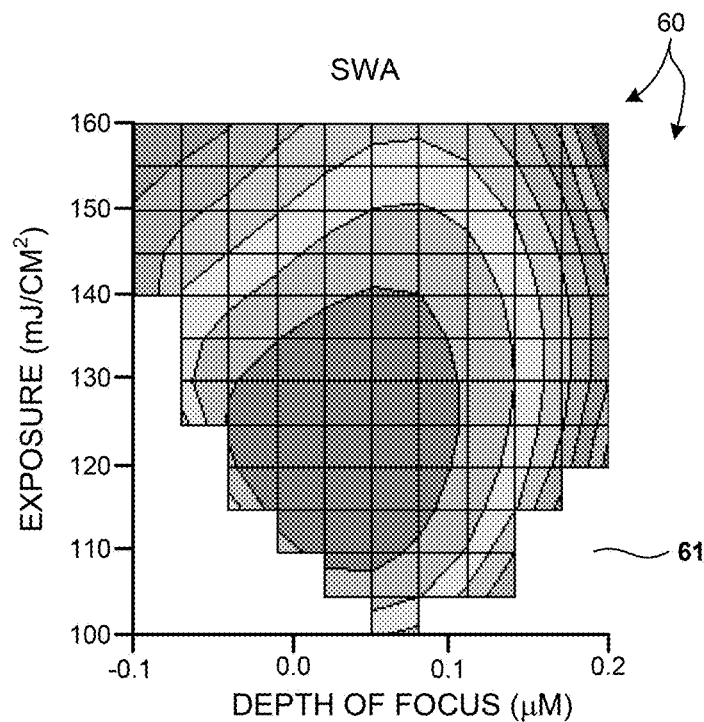
FIG. 6 is a contour plot 60 illustrative of sidewall angle values associated with each of the focus exposure matrix results illustrated in FIGS. 3-4.
Figure 7:
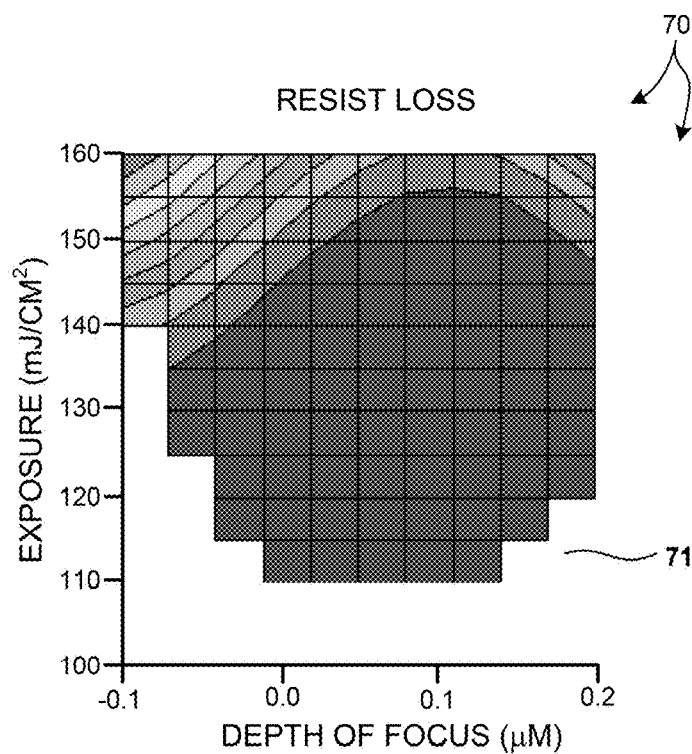
FIG. 7 is a contour plot 70 illustrative of resist loss values associated with each of the focus exposure matrix results illustrated in FIGS. 3-4.

FIGS. 5-7 illustrate contour plot 50 of CD, contour plot 60 of SWA, and contour plot 70 of resist loss, respectively. Each of the contour plots are associated with the FEM experimental results illustrated in FIGS. 3-4. Resist loss is the actual height subtracted from the nominal height of the contact hole, and thus is a measure of height. FIGS. 5-7 graphically illustrate a relationship between process parameters and metrology parameters derived from the process-based target model, and thus represent process-based constraints on metrology parameters. As such, these constraints can be used to link the process-based model with the metrology based model to generate an integrated measurement model.

Equation (1) illustrates a set of equations constraining three metrology-based model parameters (i.e., CD, H, and SWA) by two process-based model parameters (i.e., depth of focus, F, and exposure, E).

$$CD=-90+130F+1.22E-417F^2-0.448FE-0.0025E^2$$

$$Ht=-223-189F+4.16E-354F^2+1.76FE-0.0158E^2$$

$$SWA=56.5+37.4F+0.431E-230F^2-0.1222FE-0.0019E^2 \quad (1)$$

In the example illustrated by equation (1), process-based constraints are formulated based on simplified fitting functions (e.g. polynomials) applied to the FEM simulation results illustrated in FIGS. 3-7. In other examples, process-based constraints can be formulated based on process-based basis functions such as those described by U.S. Pat. No. 7,009,704 issued to KLA-Tencor Technologies Corporation on Mar. 7, 2006, the subject matter of which is incorporated herein in its entirety.

A process-based target model can be integrated with a metrology-based target model to generate an integrated measurement model in a number of different ways.

In some examples, constraints on ranges of values of metrology model parameters are determined based on the process-based target model. More specifically, the constraints are determined based on ranges of achievable values of process-model parameters.

For example, as illustrated in FIGS. 3 and 4, some combinations of focus and exposure parameter values do not yield functional contact holes. For example, as illustrated in FIG. 3, structures highlighted within region 31 of the matrix of process-based model results fail to form a hole. Similarly, as illustrated in FIG. 4, structures highlighted within region 41 of the matrix of process-based model results fail to form a hole. Similarly, as illustrated in FIGS. 5-7, combinations of focus and exposure parameter values in blank areas 51, 61, and 71, respectively, indicate a failure to form a functional structure because the particular parameter (i.e., CD, SWA, and resist loss) could not be resolved. In other words, based on the results of the process-based target model it is determined that certain ranges of focus and exposure parameter values do not yield a functional structure. These ranges of process-based model parameter values are mapped to ranges of metrology-based model parameter values to limit the ranges of metrology-based parameter values employed in subsequent measurement analysis. This reduces computation time associated with the integrated measurement model by limiting ranges of metrology parameters to potentially functional structures as determined by the process based model. By way of non-limiting example, equation (1) can be used to map the range of process-based model parameter values to ranges of metrology-based model parameter values.

In some other examples, the integrated measurement model includes the metrology-based target model constrained by the process-based target model. In one example, a measurement analysis performed to resolve metrology parameters, such as CD, H, and SWA is constrained by equation (1). In other words, only solutions for CD, H, and SWA that obey constraint equation (1) will be considered in the measurement analysis. This reduces the size of the solution space associated with the integrated measurement model. In this manner, the process-based set of constraints on metrology-based target model parameters is defined by the process-based target model and applied to the metrology-based target model.

In some other examples, one or more metrology model parameters are expressed in terms of other metrology model parameters based on the process model. In one example, SWA is expressed as a function of CD and H based on Equation (1). This reduces the total number of floating parameters of the integrated measurement model and reduces parameter correlation. This also increases the efficiency and robustness of the fitting engine (e.g., the regression engine) due to a smaller search space limited to target variations allowed by the manufacturing process.

In some other examples, process parameters are substituted into the metrology model. These process parameters are then resolved as part of the analysis of measurement data using the integrated measurement model. In this manner, the parameterization of the integrated measurement model includes process-based variables (e.g., focus and exposure), and the process parameter values are determined directly from the measurement signals. For example, an integrated measurement model can be formulated by substituting process parameters F and E, for metrology model parameters CD, H, and SWA using equation (1). After solving for F and E based on measurement data, corresponding metrology parameters CD, H, and SWA can be calculated from equation (1).

Figure 8:
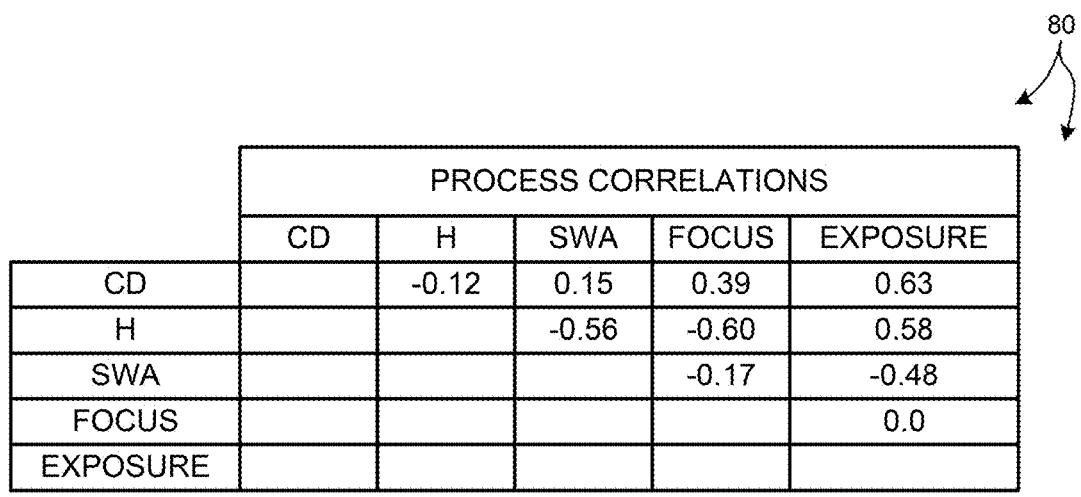
FIG. 8 is a table 80 illustrative of correlations between focus and exposure and among critical dimension, height, and sidewall angle.

This approach may be preferred to reduce correlations among parameters involved in the analysis of measurement data. For example, as illustrated in table 80 depicted in FIG. 8, the correlation between focus and exposure is much lower than the correlations among CD, H, and SWA.

Figures 9, 10, 11:
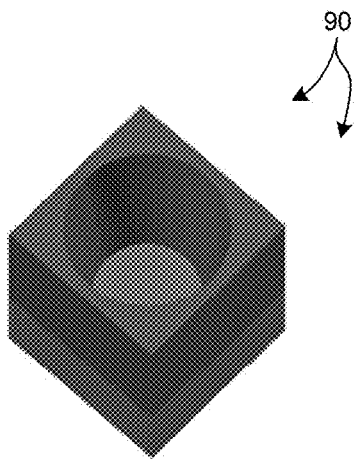
FIG. 9 is a diagram 90 illustrative of a simplified metrology model of a hole in an oxide layer subject to measurement by a two dimensional beam profile reflectometer (2-D BPR) system.
FIG. 10 is a table 100 illustrative of correlations between CD and SWA associated with the 2-D BPR measurement.
FIG. 11 is a table 110 illustrative of correlation between focus and exposure associated with the 2-D BPR measurement.
Figure 12A:
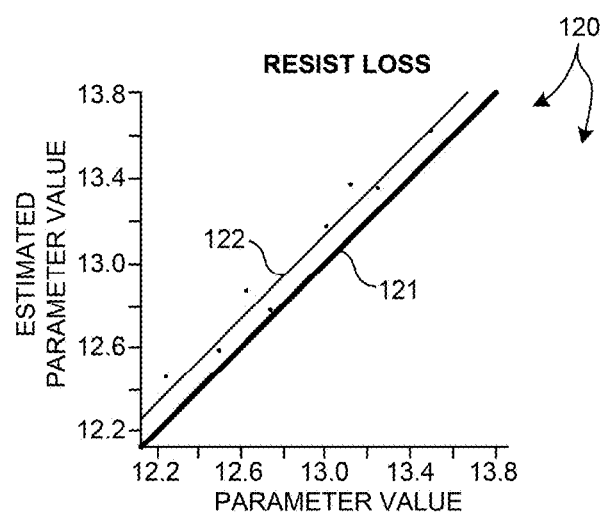
FIG. 12A-C illustrate plots 120, 130, and 140 indicative of the tracking performance of the 2-D BPR measurement of resist loss, SWA, and CD, respectively. The measurement model is parameterized by resist loss, SWA, and CD.
Figure 12B:
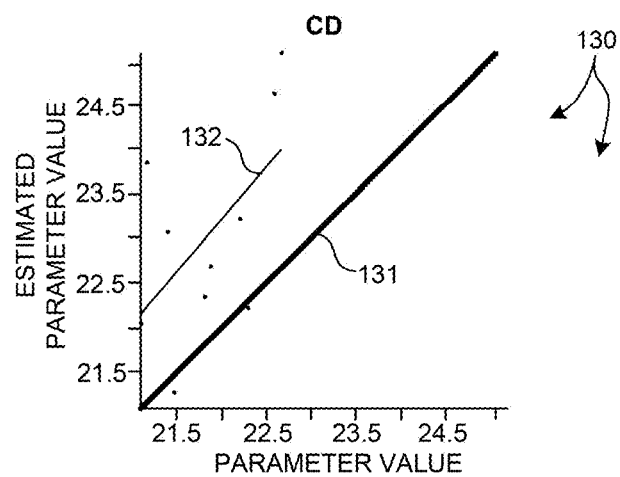
Figure 12C:
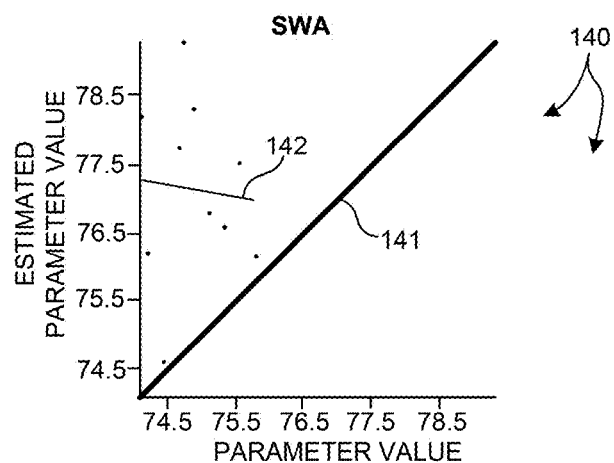

FIG. 9 is a diagram 90 illustrative of a simplified metrology model of a hole in an oxide layer subject to measurement by a two dimensional beam profile reflectometer (2-D BPR) system. Design of Experiments (DOE) simulation results demonstrate a high level of correlation between CD and SWA as illustrated in table 100 of FIG. 10. Thus, it is expected that the 2-D BPR measurement system would not be effective in distinguishing the two metrology parameters. This is further demonstrated in FIGS. 12A-12C. FIG. 12A illustrates a plot 120 indicative of the tracking performance of the 2-D BPR measurement of resist loss employing a metrology model parameterized by resist loss, SWA, and CD. Line 121 indicates perfect tracking where the estimated parameter value is the same as the actual parameter value. Line 122 is a line representing a best fit among the illustrated data points. As illustrated in FIG. 12A, the tracking performance for resist loss is good. FIG. 12B illustrates a plot 130 indicative of the tracking performance of the 2-D BPR measurement of CD employing a metrology model parameterized by resist loss, SWA, and CD. Line 131 indicates perfect tracking where the estimated parameter value is the same as the actual parameter value. Line 132 is a line representing a best fit among the illustrated data points. As illustrated in FIG. 12B, the tracking performance for CD is poor. FIG. 12C illustrates a plot 140 indicative of the tracking performance of the 2-D BPR measurement of SWA employing a metrology model parameterized by resist loss, SWA, and CD. Line 141 indicates perfect tracking where the estimated parameter value is the same as the actual parameter value. Line 142 is a line representing a best fit among the illustrated data points. As illustrated in FIG. 12C, the tracking performance for SWA is quite poor.

Figure 13A:
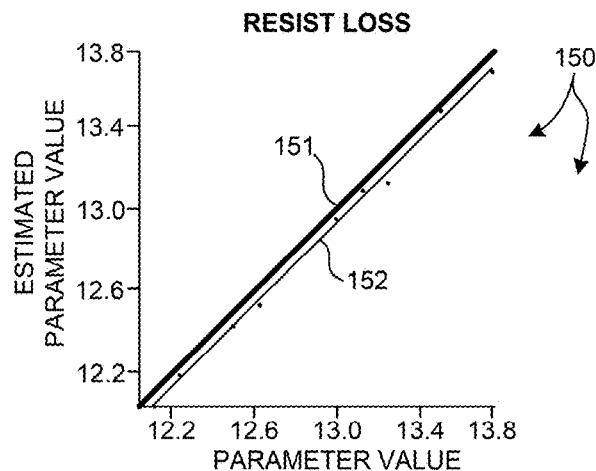
FIG. 13A-C illustrate plots 150, 160, and 170 indicative of the tracking performance of the 2-D BPR measurement of resist loss, SWA, and CD, respectively. The measurement model is parameterized by resist loss, SWA, and CD and is constrained by the process model.
Figure 13B:
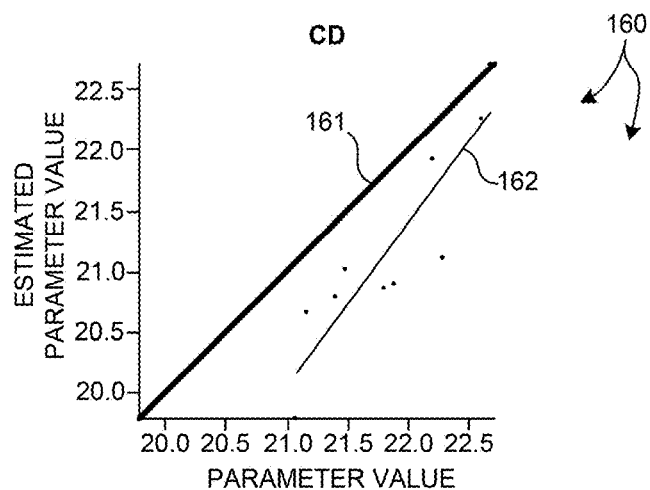
Figure 13C:
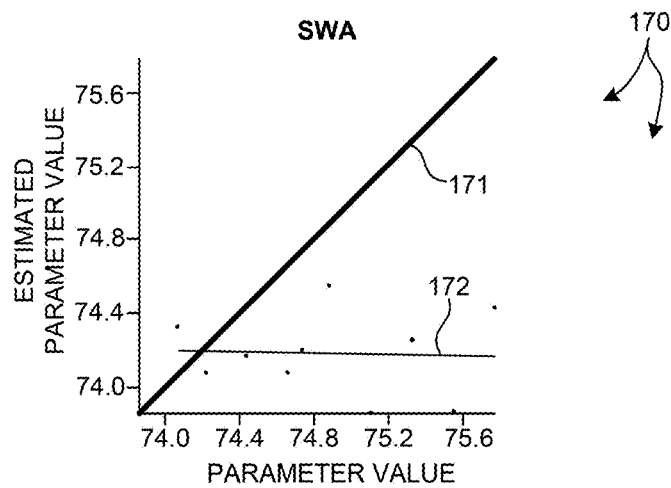

FIGS. 13A-13C illustrate the tracking performance associated with 2-D BPR measurements of resist loss, CD, and SWA, respectively, employing an integrated measurement model where the metrology model parameterized by resist loss, CD, and SWA is constrained by the process model (i.e., resist loss, CD, and SWA are constrained by focus and exposure). FIG. 13A illustrates a plot 150 indicative of the tracking performance of the 2-D BPR measurement of resist loss employing the integrated measurement model parameterized by resist loss, SWA, and CD. Line 151 indicates perfect tracking where the estimated parameter value is the same as the actual parameter value. Line 152 is a line representing a best fit among the illustrated data points. As illustrated in FIG. 13A, the tracking performance for resist loss is quite good. FIG. 13B illustrates a plot 160 indicative of the tracking performance of the 2-D BPR measurement of CD employing the integrated measurement model parameterized by resist loss, SWA, and CD. Line 161 indicates perfect tracking where the estimated parameter value is the same as the actual parameter value. Line 162 is a line representing a best fit among the illustrated data points. As illustrated in FIG. 13B, the tracking performance for CD is improved compared to the tracking performance illustrated in FIG. 12B. FIG. 13C illustrates a plot 170 including plotlines 171 and 172 indicative of the tracking performance of the 2-D BPR measurement of SWA employing the integrated measurement model parameterized by resist loss, SWA, and CD. As illustrated in FIG. 13C, the tracking performance for SWA remains quite poor.

Figure 14A:
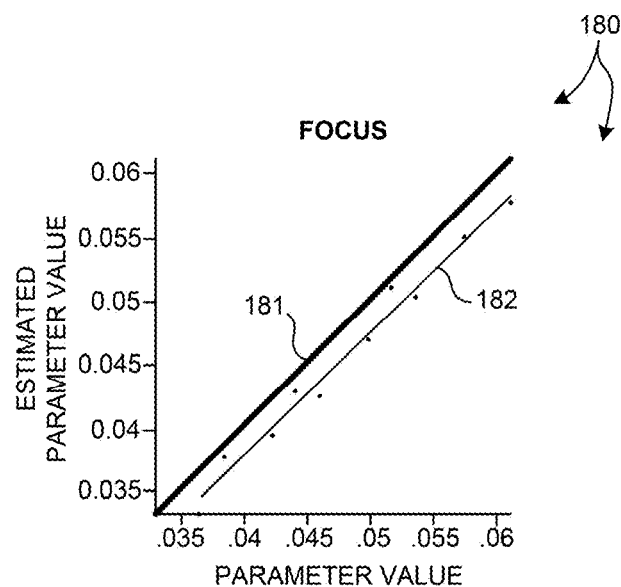
FIGS. 14A-14B illustrate plots 180 and 190 indicative of the tracking performance associated with 2-D BPR measurements of focus and exposure, respectively. The measurement model is parameterized by focus and exposure.
Figure 14B:
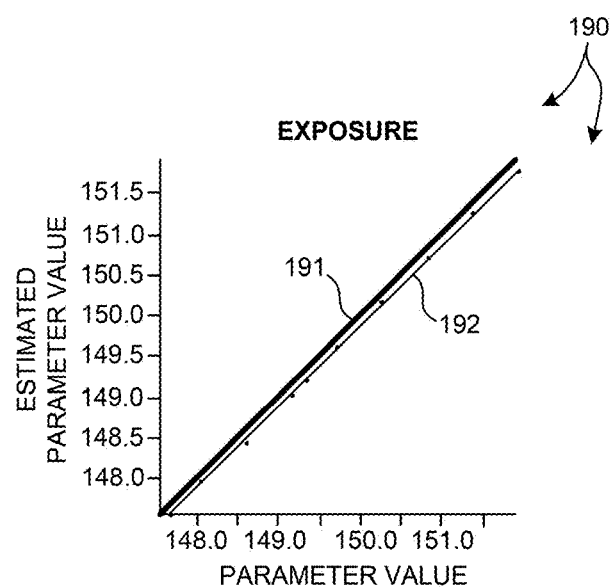

FIGS. 14A-14B illustrate the tracking performance associated with 2-D BPR measurements of focus and exposure, respectively, when employing an integrated measurement model where the model is parameterized by focus and exposure. FIG. 14A illustrates a plot 180 indicative of the tracking performance of the 2-D BPR measurement of focus employing the integrated measurement model parameterized by focus and exposure. Line 181 indicates perfect tracking where the estimated parameter value is the same as the actual parameter value. Line 182 is a line representing a best fit among the illustrated data points. As illustrated in FIG. 14A, the tracking performance for focus is quite good. Similarly, FIG. 14B illustrates a plot 190 indicative of the tracking performance of the 2-D BPR measurement of exposure employing the integrated measurement model parameterized by focus and exposure. Line 191 indicates perfect tracking where the estimated parameter value is the same as the actual parameter value. Line 192 is a line representing a best fit among the illustrated data points. As illustrated in FIG. 14B, the tracking performance for exposure is quite good. As illustrated in table 110 of FIG. 11, the correlation between focus and exposure is significantly less than the correlations among SWA and CD. Thus, the 2-D BPR measurement is able to resolve focus and exposure with greater success than CD and SWA.

In this manner, an integrated measurement model is used to accurately measure process parameters of interest (e.g. depth of focus, exposure, etch time, deposition time, etc.). This method significantly increases the information transferred between the measurement signal and the measured process parameters, improving the accuracy and measurement time.

In another example, the integrated measurement model is built based on process simulation results. Typically, a metrology-based target model is a simple approximation of the real target. For example, the metrology model for resist line measurement is often a simple trapezoid, where SWA, CD and H are measured. This is a significant approximation of the actual variation of target geometry due to process variations (e.g., variations in focus and exposure). As a result, attempts to characterize focus and exposure based on measurement results from a highly simplified metrology model may prove fruitless because the actual geometric impact of different process parameter values is not captured by the measurement.

Figure 16:
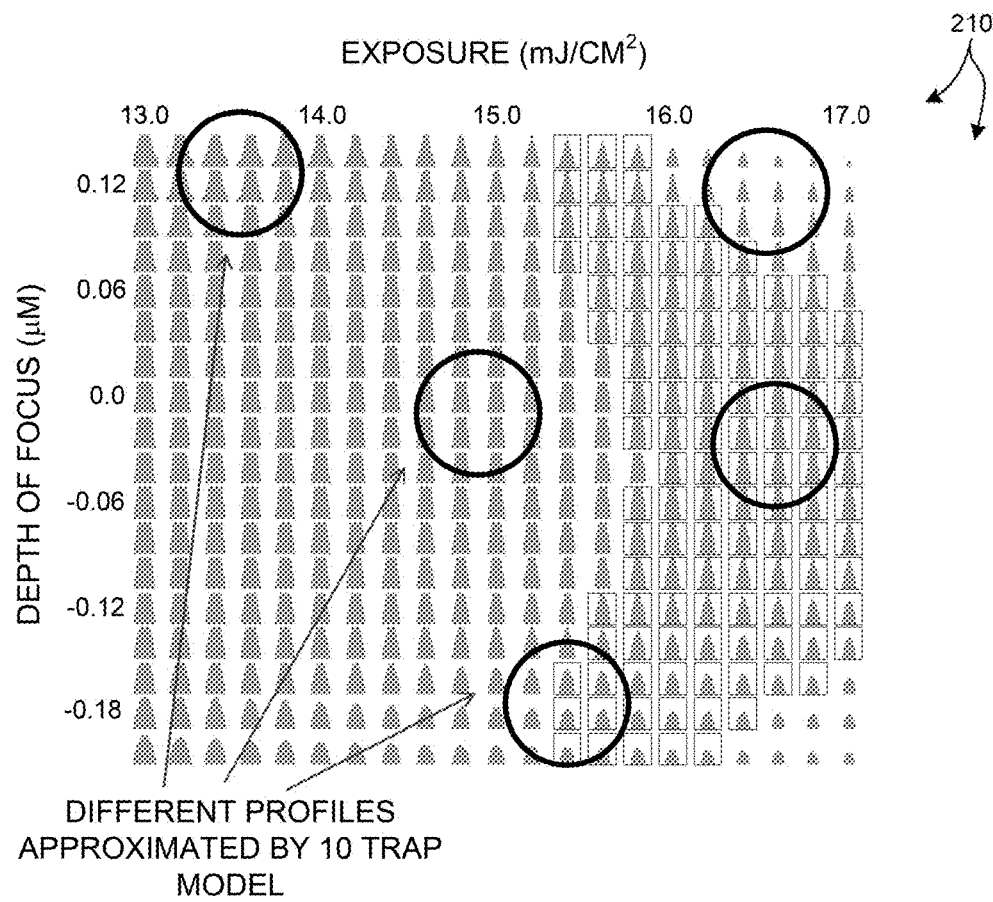
FIG. 16 is a plot 210 illustrative of focus exposure matrix simulation results of the structure illustrated in FIG. 15.

By way of example, FIG. 16 illustrates target profiles having complex sidewall shapes in a focus exposure matrix. If a highly simplified metrology model is used, a portion of the process variation information illustrated in FIG. 16 is lost. However, in some examples an integrated measurement model including a more complex geometric parameterization effectively captures the shape profiles resulting from the process. In this manner, measurement signals can be effectively analyzed to determine process parameter values.

Figure 15:
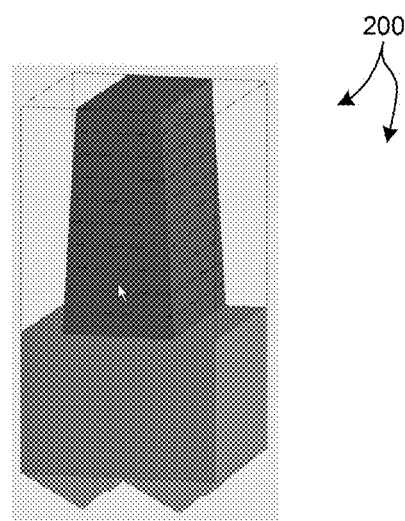
FIG. 15 is a diagram 200 illustrative of a structure modeled by a discretized 10 trap model to capture the shape variations resulting from process variation.

FIG. 15 illustrates a discretized 10 trap (12 DOF) model used to capture the shape variations resulting from process variation. The model includes 11 CDs at different heights. The measured CDs reflect the process variations and can predict depth of focus and exposure more accurately than a single trapezoid geometric model parameterized by CD, SWA, and HT. In this manner, the integrated measurement model is the metrology model illustrated in FIG. 15 built based on the process model simulation results illustrated in FIG. 16. Although, sidewall shape variation is illustrated in FIG. 16 and captured by the model illustrated in FIG. 15, other shape variations may be considered (e.g., resist line topology changes, etc.).

In some examples, an integrated measurement model is used to measure process parameter values sequentially. The integrated measurement model includes a metrology-based target model used as part of a measurement analysis to determine geometric parameter values from measurement data. The integrated measurement model also includes a process-based model to determine process parameter values from the geometric parameter values.

In one example, the metrology based target model is parameterized by a process based principal component analysis (PCA) parameterization described in U.S. Patent Publication No. 2013/0110477 by Stilian Pandev, the subject matter of which is incorporated herein by reference. A process based PCA parameterization effectively reduces the number of degree of freedom of the metrology-based model such that the model parameters can be effectively resolved from measurement data without excessive loss of measurement information. In one example, the model reduction is performed to constrain the geometrically discretized model, illustrated in FIG. 15, within the process variation space. The measured geometry (e.g., CDs of FIG. 15) is provided as input to the process model that predicts the focus and exposure. In one example, a neural network is used as the process model. The neural network model predicts the focus and exposure parameter values based on the measured CDs.

In a further aspect, the neural network model is trained by process model data. More specifically, the neural network model is trained with the shape profiles produced by the PROLITH simulator, such as those illustrated in FIG. 16. In this manner, the focus and exposure parameter values are expressed as a function of sidewall shape parameters CD1 . . . CDn and HT, allowing more process information to be captured by the neural network model. This reduces the information loss from the target measurement to the focus and exposure estimate measurement compared to utilizing a single trapezoid model having three parameters (i.e., CD, SWA and HT).

FIG. 17A illustrates the results of a principal component analysis used as an indication of the process information content present in the process variations (focus and exposure). FIG. 17A illustrates that the process variation information is transferred to the 12 DOF geometric model, and that the information is effectively captured by two or three PCA components.

FIG. 17B illustrates the results of a principal component analysis used as an indication of the process information content present in the measurement signals (e.g., alpha, beta). The more information transferred to the signal or the geometric model, the better the metrology/process model can extract and separate the process parameters (e.g. focus and exposure).

In some examples, an integrated measurement model is used to measure process parameter values directly from measurement signals.

For example, as discussed hereinbefore, process parameters may be substituted into the metrology based target model. In this manner, process parameter values are directly resolved from measurement data.

In some other examples, the integrated measurement model is a neural network model that receives measurement signals and determines focus and exposure parameter values directly. The neural network model is trained using shape profiles generated by a process model (e.g., shape profiles generated by PROLITH and illustrated in FIG. 16) and the corresponding measurement spectra generated by a metrology model. During neural net training the process simulator (e.g., PROLITH) is used to produce the target profiles for given process variations. Measurement spectra corresponding to each shape profile are generated by an RCWA engine. The neural network is trained with the generated spectra. PCA is performed on the generated spectra to reduce the number of degrees of freedom.

During measurement, measurement spectra are received by an analysis engine and the measured spectra are transformed to Principal Components (PCs) by the PCA transformation used during training. The trained neural network model receives the PCs and determines the focus and exposure parameters directly.

In another example, the neural network may be trained based on measured spectra from a DOE (FEM) wafer. In this example, a process simulator or model is not needed. This reduces the errors from the RCWA engine and the process simulator, but increases the requirements for the process variations in the DOE wafer.

By employing an integrated measurement model to measure process parameter values directly from measurement signals, the information loss is reduced by eliminating intermediate models (e.g., geometric, material, or other models that approximate the measurement system). In addition, measurement time may be reduced by eliminating the regression operation.

In another aspect, the process model can be improved based on the metrology model. In some examples, the calibration of a process model is improved using information obtained from the metrology model. In one example, pre-characterized relationships between geometrical profile and process variations can be used for process recipe generation. In addition, the process model can be calibrated in a way that optimizes the metrology model.

Even more generally, the use of process and metrology models is fully integrated with one model providing input to the other.

In yet another aspect, the disclosed methods and systems may be employed in the context of multi-target modeling. In some examples, the integrated measurement model allows for the combined analysis of multiple targets where some targets are resolved using metrology model parameters while other targets are resolved using process parameters. In addition, constraints derived from a process model can be used to link parameters of different targets.

Although several examples are described hereinbefore with reference to a lithography process model and associated focus and exposure metrologies, the methods and systems described herein may involve other process models (e.g., etch or deposition processing), and other metrologies (e.g., etch and deposition metrologies). The methods and systems described herein may also involve other reference metrology technologies (e.g. SEM, TEM, AFM, X-ray). Moreover, the methods and systems described herein are discussed with reference to optical metrology systems (e.g., spectroscopic ellipsometers, reflectometers, BPR systems, etc.), but can be also applied to other model-based metrologies (e.g., overlay, CD-SAXS, XRR, etc.).

In yet another aspect, a cross-wafer process variation model may be combined with process-based models of target structures. Often the process affects the whole wafer creating a cross-wafer process specific pattern. In one example, it is commonly observed that a film deposition process often results in a film thickness having a radial symmetry pattern across the wafer.

In some examples, cross-wafer process information is used in combination with the process variation information encoded in a single target to create an accurate integrated measurement model. In one example, one or more cross-wafer film models of underlying films are combined with a 10 trap model parameterized based on process variations established by PROLITH. By constraining the grating to the variation in process space and constraining the underlying films to an expected symmetrical film, the grating to film correlations are significantly reduced and measurement accuracy is improved.

In yet another aspect, the integrated measurement model can be used to provide active feedback to a process tool (e.g., lithography tool, etch tool, deposition tool, etc.). For example, values of the depth and focus parameters determined using an integrated measurement model can be communicated to the lithography tool to adjust the lithography system to achieve a desired output. In a similar way etch parameters (e.g., etch time, diffusivity, etc.) or deposition parameters (e.g., time, concentration, etc.) may be included in the integrated measurement model to provide active feedback to etch tools or deposition tools, respectively.

Figure 18:
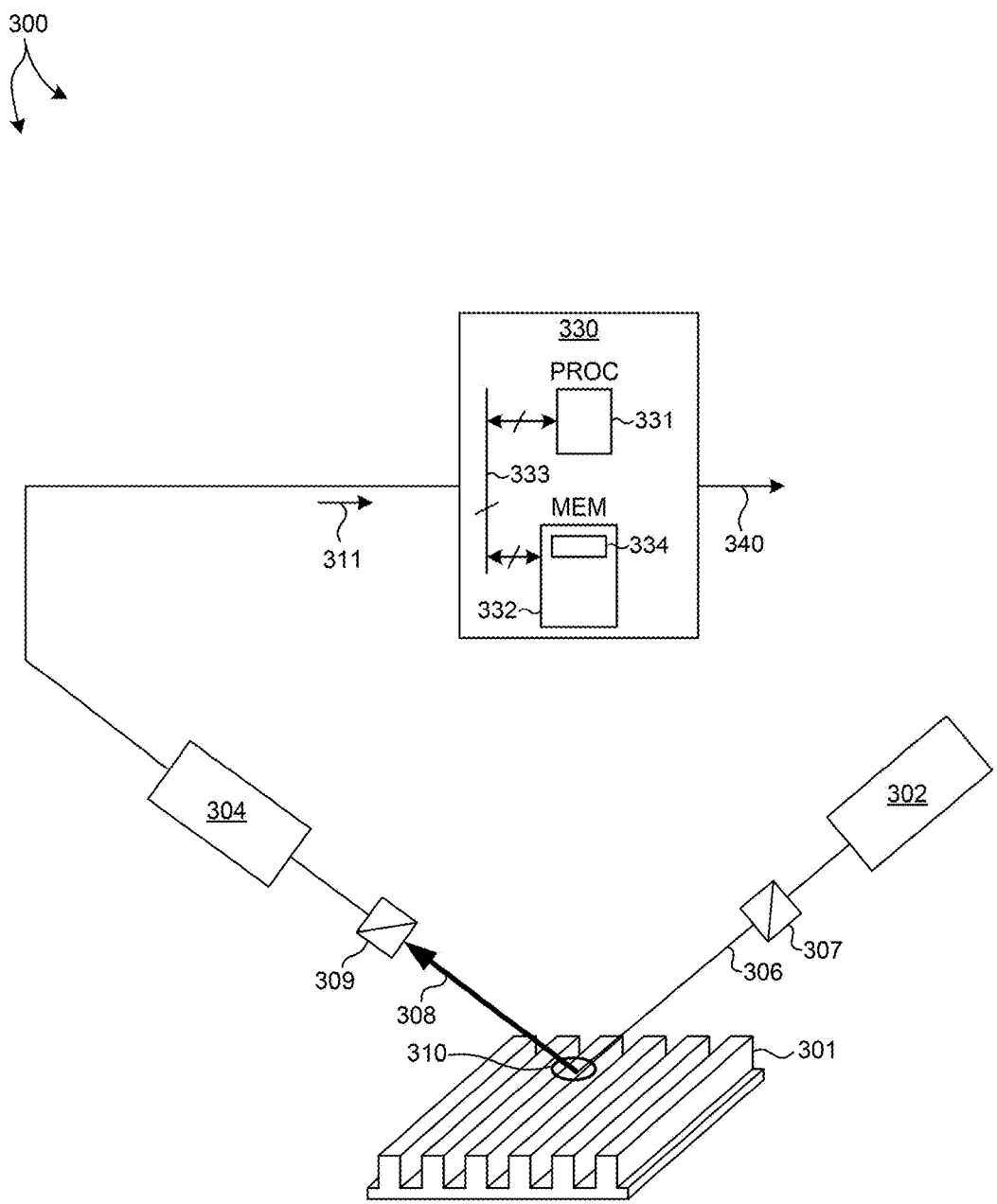
FIG. 18 is a diagram illustrative of a system 300 for measuring characteristics of a specimen in accordance with the exemplary methods presented herein.

FIG. 18 illustrates a system 300 for measuring characteristics of a specimen in accordance with the exemplary methods presented herein. As shown in FIG. 18, the system 300 may be used to perform spectroscopic ellipsometry measurements of one or more structures of a specimen 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 150-850 nm) to the structure disposed on the surface of the specimen 301. In turn, the spectrometer 304 is configured to receive illumination reflected from the surface of the specimen 301. It is further noted that the light emerging from the illuminator 302 is polarized using a polarization state generator 307 to produce a polarized illumination beam 306. The radiation reflected by the structure disposed on the specimen 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure.

As depicted in FIG. 18, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 300 may include one or more computing systems 330 employed to perform measurement based on an integrated measurement model in accordance with the methods described herein. The one or more computing systems 330 may be communicatively coupled to the spectrometer 304. In one aspect, the one or more computing systems 330 are configured to receive measurement data 311 associated with measurements of the structure of specimen 301.

In a further embodiment, the one or more computing systems 330 are configured to access model parameters in real-time, employing Real Time Critical Dimensioning (RTCD), or it may access libraries of pre-computed models for determining an integrated measurement model in accordance with the methods described herein.

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of the integrated metrology system 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 330 and other systems (e.g., memory on-board metrology system 300, external memory, reference measurement source 320, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. Moreover, the computer system 330 may send data to other systems via a transmission medium. For instance, an integrated measurement model or a specimen parameter 340 determined by computer system 330 may be communicated and stored in an external memory. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 334 implementing methods such as those described herein may be transmitted over a transmission medium such as a wire, cable, or wireless transmission link. For example, as illustrated in FIG. 18, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

Figure 19:
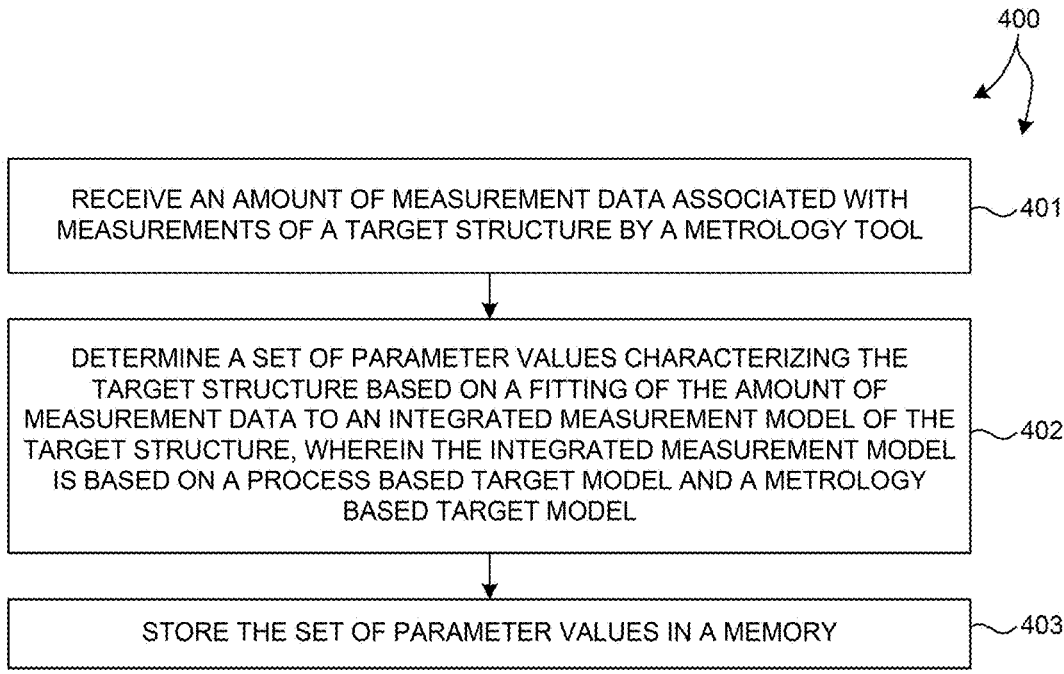
FIG. 19 is a flowchart illustrative of an exemplary method 400 suitable for implementation by the metrology system 300 of the present invention.

FIG. 19 illustrates a method 400 suitable for implementation by the metrology system 300 of the present invention. In one aspect, it is recognized that data processing blocks of method 400 may be carried out via a pre-programmed algorithm executed by one or more processors of computing system 330. While the following description is presented in the context of metrology system 300, it is recognized herein that the particular structural aspects of metrology system 300 do not represent limitations and should be interpreted as illustrative only.

In block 401, an amount of measurement data is received by a computing system (e.g., computing system 330). The measurement data is associated with measurements of a target structure by a metrology tool (e.g., system 300).

In block 402, a set of parameter values characterizing the target structure is determined based on a fitting of the amount of measurement data to an integrated measurement model of the target structure. The integrated measurement model is based on a process based target model and a metrology based target model.

In block 403, the set of parameter values are stored in memory. The second set of parameter values may be stored on-board the measurement system 300, for example, in memory 332, or may be communicated (e.g., via output signal 340) to an external memory device.

Figure 20:
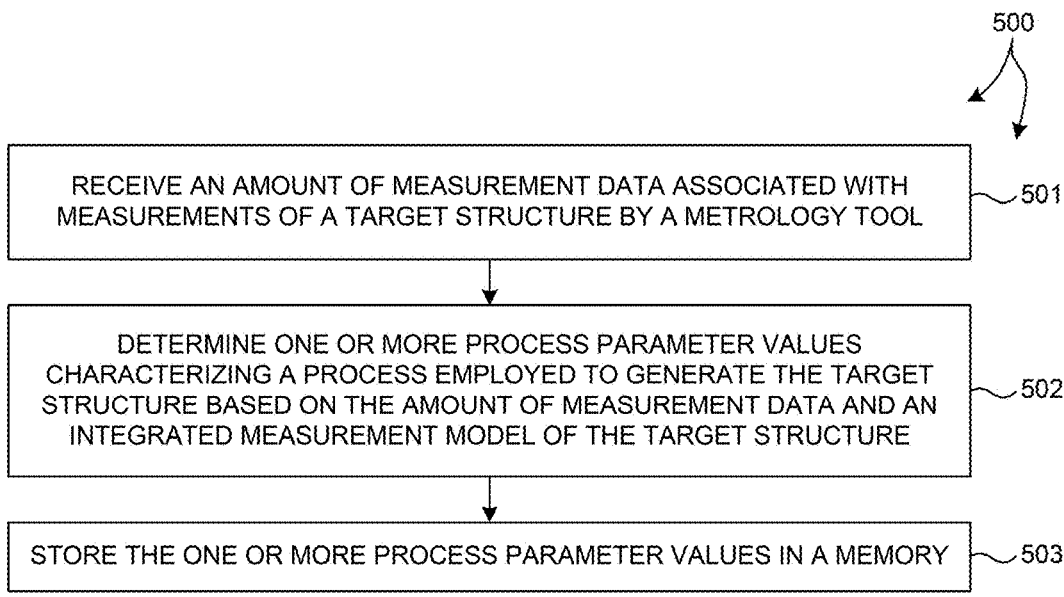
FIG. 20 is a flowchart illustrative of an exemplary method 500 suitable for implementation by the metrology system 300 of the present invention.

FIG. 20 illustrates a method 500 suitable for implementation by the metrology system 300 of the present invention. In one aspect, it is recognized that data processing blocks of method 500 may be carried out via a pre-programmed algorithm executed by one or more processors of computing system 330. While the following description is presented in the context of metrology system 300, it is recognized herein that the particular structural aspects of metrology system 300 do not represent limitations and should be interpreted as illustrative only.

In block 501, an amount of measurement data is received by a computing system (e.g., computing system 330). The measurement data is associated with measurements of a target structure by a metrology tool (e.g., system 300).

In block 502, one or more process parameter values characterizing a process employed to generate the target structure are determined based on the amount of measurement data and an integrated measurement model of the target structure.

In block 503, the one or more process parameter values are stored in memory. The parameter values may be stored on-board the measurement system 300, for example, in memory 332, or may be communicated (e.g., via output signal 340) to an external memory device.

In general, the systems and methods described herein can be implemented as part of the process of preparing an integrated measurement model for off-line or on-tool measurement. In addition, both measurement models and any reparameterized measurement model may describe one or more target structures and measurement sites.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   providing illumination radiation to a target structure fabricated on a semiconductor wafer, the illumination radiation provided by an illumination source of a metrology tool;
   detecting an amount of radiation from the target structure in response to the illumination radiation, the amount of radiation detected by a detector of the metrology tool;
   generating a measured response associated with the target structure based on the detected radiation, the measured response comprising an amount of measurement data;
   determining a set of geometric parameter values characterizing the target structure and one or more process parameter values characterizing a fabrication process employed by a semiconductor process tool to fabricate the target structure on the semiconductor wafer based on a fitting of the amount of measurement data to an integrated measurement model of the target structure, wherein the integrated measurement model is based on a process based target model that constrains values of one or more of the set of geometric parameters characterizing the target structure based on a range of achievable values of one or more fabrication process parameters of the process based target model and a metrology based target model that predicts the measured response based on a model of an interaction of the target structure with the metrology tool; and
   communicating the one or more process parameter values to the semiconductor process tool, that causes the semiconductor process tool to adjust one or more process parameters of the semiconductor process tool to achieve a desired target structure.

2. The method of claim 1, wherein the process-based target model characterizes the target structure in terms of at least one process parameter.

3. The method of claim 2, further comprising:
generating the integrated measurement model based on a linkage between one or more parameters of the process-based target model and one or more parameters of the metrology-based target model.

4. The method of claim 3, wherein the linkage is a constraint on a range of values of a metrology model parameter determined based on a range of process model parameter values.

5. The method of claim 3, wherein the linkage is a constraint on the one or more metrology parameters determined from the process-based target model.

6. The method of claim 3, wherein the linkage is a functional relationship between two or more metrology model parameters determined from the process-based target model.

7. The method of claim 1, wherein the one or more process parameters are parameters of the integrated measurement model of the target structure.

8. The method of claim 1, wherein the one or more process parameters are the only parameters of the integrated measurement model of the target structure.

9. The method of claim 1, wherein the determining of the one or more process parameter values involves determining one or more metrology parameter values based on the fitting of the amount of measurement data to the integrated measurement model and determining the one or more process parameter values based on a functional relationship between the one or more process parameters and the one or more metrology parameters.

10. The method of claim 1, wherein the determining of the one or more process parameter values involves transforming the measurement data to principal components and determining the one or more process parameter values directly from the principal components.

11. The method of claim 1, wherein the one or more process parameter values include any of a depth of focus value, an exposure value, an etch time, and a deposition time.

12. A method comprising:
providing illumination radiation to a target structure fabricated on a semiconductor wafer, the illumination radiation provided by an illumination source of a metrology tool;
detecting an amount of radiation from the target structure in response to the illumination radiation, the amount of radiation detected by a detector of the metrology tool;
generating a measured response associated with the target structure based on the detected radiation, the measured response comprising an amount of measurement data;
determining one or more process parameter values characterizing a process employed to generate the target structure based on the amount of measurement data and an integrated measurement model of the target structure, wherein the integrated measurement model is based on a process based target model that constrains values of one or more of the set of geometric parameters characterizing the target structure based on a range of achievable values of one or more fabrication process parameters of the process based target model and a metrology based target model that predicts the measured response based on a model of an interaction of the target structure with the metrology tool; and
storing the one or more process parameter values in a memory.

13. The method of claim 12, wherein the determining the one or more process parameter values involves determining at least one geometric parameter based on a fitting of the amount of measurement data to the metrology-based target model, and
determining the one or more process parameter values based on the process-based target model and the at least one geometric parameter.

14. The method of claim 13, wherein the process-based target model is a neural network model.

15. The method of claim 14, further comprising:
training the neural network model based at least in part on process model data.

16. The method of claim 13, wherein the integrated measurement model is a neural network model, and further comprising:
training the neural network model based at least in part on process model data and measurement signals corresponding to the process model data.

17. The method of claim 13, further comprising:
generating the integrated measurement model based on simulation results from a process-based target model.

18. The method of claim 12, wherein the one or more process parameter values include any of a depth of focus value, an exposure value, an etch time, and a deposition time.

19. The method of claim 12, wherein the determining of the one or more process parameter values characterizing a process involves transforming the measurement data to principal components and determining the one or more process parameter values directly from the principal components.

20. A system comprising:
an optical metrology tool including an illumination source providing illumination radiation to a target structure fabricated on a semiconductor wafer and a detector detecting an amount of radiation from the target structure in response to the illumination radiation, the optical metrology tool configured to generate a measured response associated with the target structure based on the detected radiation, the measured response comprising an amount of measurement data; and
a non-transitory, computer-readable medium, storing instructions that, when executed by one or more processors, cause the one or more processors to:
determine a set of parameter values characterizing the target structure based on a fitting of the amount of measurement data to an integrated measurement model of the target structure, wherein the integrated measurement model is based on a process based target model that constrains values of one or more of the set of geometric parameters characterizing the target structure based on one or more fabrication process parameters, of the process based target model by mathematically linking values of one or more parameters of the process based target model to values of one or more of the set of geometric parameters characterizing the target structure and a metrology based target model that predicts the measured response based on a model of an interaction of the target structure with the metrology tool; and
store the set of parameter values in a memory.

21. The system of claim 20, wherein the process-based target model characterizes the target structure in terms of at least one process parameter.

22. The system of claim 21, wherein the integrated measurement model is based on a linkage between one or more parameters of the process-based target model and one or more parameters of the metrology-based target model.

23. The system of claim 20, wherein the integrated measurement model is based on simulation results from a process-based target model.

24. The system of claim 20, further comprising:
determining one or more process parameter values based on a fitting of the amount of measurement data to the integrated measurement model of the target structure; and
storing the one or more process parameter values in a memory.

25. The system of claim 24, wherein the determining of the one or more parameter values involves transforming the measurement data to principal components and determining the one or more process parameter values directly from the principal components.

26. The system of claim 24, wherein the one or more process parameter values include any of a depth of focus value, an exposure value, an etch time, and a deposition time.

27. A system comprising:
an illumination source of a metrology tool that provides illumination radiation to a target structure fabricated on a semiconductor specimen;
a detector of the metrology tool that detects light from the target structure in response to the illumination light and generates a measured spectral response, the measured spectral response comprising an amount of measurement data;
a non-transitory, computer-readable medium, storing instructions that, when executed by one or more processors, cause the one or more processors to:
determine one or more process parameter values characterizing a process employed to generate the target structure based on the amount of measurement data and an integrated measurement model of the target structure, wherein the integrated measurement model is based on a process based target model that constrains values of one or more of the set of geometric parameters characterizing the target structure based on a range of achievable values of one or more fabrication process parameters of the process based target model and a metrology based target model that predicts the measured response based on a model of an interaction of the target structure with the metrology tool; and
store the one or more process parameter values in a memory.

28. The system of claim 27, wherein the determining the one or more process parameters involves
determining at least one geometric parameter based on a fitting of the amount of measurement to the metrology-based target model, and
determining the one or more process parameter values based on the process-based target model and the at least one geometric parameter.

29. The system of claim 27, wherein the determining of the one or more process parameter values involves transforming the measurement data to principal components and determining the one or more process parameter values directly from the principal components.

30. The system of claim 27, wherein the one or more process parameter values include any of a depth of focus value, an exposure value, an etch time, and a deposition time.

* * * * *